United States Patent [19]

Smith

[11] 4,352,492

[45] Oct. 5, 1982

[54] DATA STORAGE APPARATUS

[75] Inventor: Ronald A. Smith, Los Gatos, Calif.

[73] Assignee: Fairchild Camera & Instrument Corp., Mountain View, Calif.

[21] Appl. No.: 745,025

[22] Filed: Nov. 26, 1976

Related U.S. Application Data

[62] Division of Ser. No. 716,909, Aug. 23, 1976, Pat. No. 4,095,791.

[51] Int. Cl.³ .................. B63B 71/04; A63F 9/00
[52] U.S. Cl. ..................... 273/1 GC; 361/399; 361/415; 273/DIG. 28
[58] Field of Search ........... 339/75 MP, 175 MP, 43; 361/415, 399; 338/93; 273/DIG. 28, 85 G

[56] References Cited

U.S. PATENT DOCUMENTS

1,094,806  4/1914  Newton .................. 339/43
3,188,598  6/1965  Pferd .................... 339/75 MP
3,668,476  6/1972  Wrabel et al. ........... 361/395
3,789,345  1/1974  Reimer et al. .......... 339/75 MP
3,921,161  11/1975 Baer ..................... 358/93

*Primary Examiner*—David Smith, Jr.
*Attorney, Agent, or Firm*—Kenneth Olsen; Theodore S. Park; Warren M. Becker

[57] ABSTRACT

A video game apparatus for connection to a standard television set and including an electronics-containing console having a plurality of parameter selection buttons and a chute mechanism for receiving a replaceable cartridge-containing supplementary electronic circuitry, and a pair of hand controllers for providing player control inputs to the console electronics. Improved connector apparatus is associated with the chute mechanism to enable electrical connection to be made to a cartridge contained printed circuit board with a minimum of insertion force.

21 Claims, 12 Drawing Figures

Fig_1

Fig_2

Fig_6

Fig_7

Fig_8

Fig_12

DATA STORAGE APPARATUS

CROSS-REFERENCE TO RELATED APPLICATION

This is a divisional application of pending application Ser. No. 716,909, filed Aug. 23, 1976 for Video Game Apparatus now U.S. Pat. No. 4,095,791.

BACKGROUND OF THE INVENTION

1. Field of the Invention

The present invention relates generally to video game apparatus and, more particularly, to a self-contained video signal generating device for use in association with a standard black-and-white or color television set and which includes preprogrammed data relating to several selectible games as well as means for receiving a preprogrammed cartridge containing other data that may be selected to provide additional game play.

2. Description of the Prior Art

Self-contained home entertainment video modules of the prior art have typically been restricted to only a few games having only the most elementary player interaction in terms of freedom of movement of game balls, paddles and other movable game objects. This, of course, means that once a purchase is made of a particular console having certain available game selection, no new game can be added, and one must purchase an entirely new console if he wishes to play additional games. Moreover, prior art devices have typically limited player control to two or three directions of object movement or function, thereby reducing the possibility of providing play action closely simulating actual real life action.

SUMMARY OF THE PRESENT INVENTION

It is therefore a principal object of the present invention to provide a video game apparatus for use in association with standard television receivers which permits a high degree of interaction between player and electronics and which enables a player to select from a multiplicity of various games.

Another object of the present invention is to provide a video game apparatus which can be selectively programmed, through the use of interchangeable preprogrammed electronics containing cartridges or the like, to include data relating to a large plurality of various games.

Still another object of the present invention is to provide a video game apparatus including player control devices which enable numerous displayed object movements and actions to be controlled by the players.

A still further object of the present invention is to provide a video game apparatus having an improved electrical connector assembly which reduces the force required to mate a cartridge-contained printed circuit board with console-contained electrical contacts.

Yet another object of the present invention is to provide a video game apparatus having means for enabling a relatively large number of game play parameters to be selected.

Briefly, the present invention includes a console containing the operative video signal generating and control electronics of the system, a plurality of push button switches which enable game mode, time, and other parameter selection inputs to be made to the electronics, and novel printed circuit board connector hardware; additional game data containing cartridges which mate with the connector hardware and enable any of a large number of games to be selectively programmed into the apparatus; and a pair of hand controller devices which provide active player interface to the electronics.

An important advantage of the present invention is that it utilizes the most modern electronics components and data handling techniques to enable a high degree of interaction between player and game controlling electronics.

Another advantage of the present invention is that it includes improved printed circuit board connector hardware which makes it possible to easily engage and disengage a cartridge containing printed circuit board mounted electronic components and circuitry.

These and other advantages of the present invention will no doubt become apparent to those skilled in the art after having read the following detailed description of a preferred embodiment which is illustrated in the several figures of the drawing.

DETAILED DESCRIPTION OF THE PREFERRED EMBODIMENT

Figure 1:
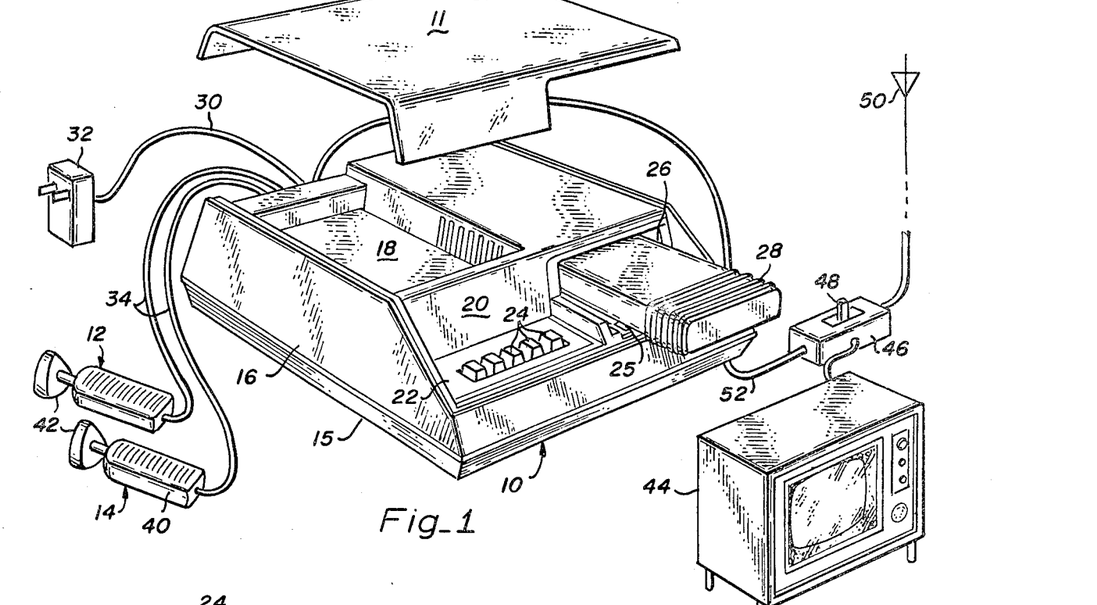
FIG. 1 is a perspective view generally illustrating the various component parts of a video game apparatus in accordance with the present invention.

Referring now to FIG. 1 of the drawing, there is shown a video game device in accordance with the present invention. The device includes a console 10 made of molded plastic aesthetically designed to complement most television sets or decorative shelves when mounted thereupon, a molded plastic dust cover 11 and a pair of hand-held controller units 12 and 14. Console 10 has an outer housing comprised of a molded base 15 and a molded top 16. The dust cover 11 is shown raised above the top 16 to reveal a storage compartment 18 for storing the hand controllers 12 and 14 when they are not in use. The front of console 10 is stepped as illustrated at 20 to provide a control panel including a horizontal surface 22 having openings on the left side for five game and parameter selection buttons 24 to extend through and an opening on the right side for a cartridge eject bar 25 (see FIG. 7) to extend into. The vertical wall of the stepped front is provided with an opening 26 on the right side for receiving a cartridge 28. The cartridge 28 includes preprogrammed electronics which cooperate with the permanent electronics of the console to enable games other than those contained in the console circuitry to be played.

Attached to the rear of console 10 is a power cord 30 having a standard line voltage AC to low voltage AC adaptor 32 affixed to its end. The use of the remote adaptor conserves space and weight in the console housing and serves as a safety feature in that no line voltages are present in the console.

Game, play period and play mode selection input is made through buttons 24, as explained below, while player control input to console 10 is made through the pair of hand controller units 12 and 14 which are each connected to the console electronics through the rear of the console by a nine conductor cable 34. As will also be described in more detail below, the hand controllers each include a hand-grip configured body portion 40 and a movable "joy stick" with control knob 42, and enable a multiplicity of active control inputs to be made to the electronics of console 10. The video output from console 10 is coupled into the antenna lead terminals of a standard black-and-white or color television set, shown at 44, through a two-position switch 46. The switch 46 has a manually operable selector 48 that enables signals input to the television set to be selected from either an external antenna 50 or the video game signal input lead 52.

Figure 2:
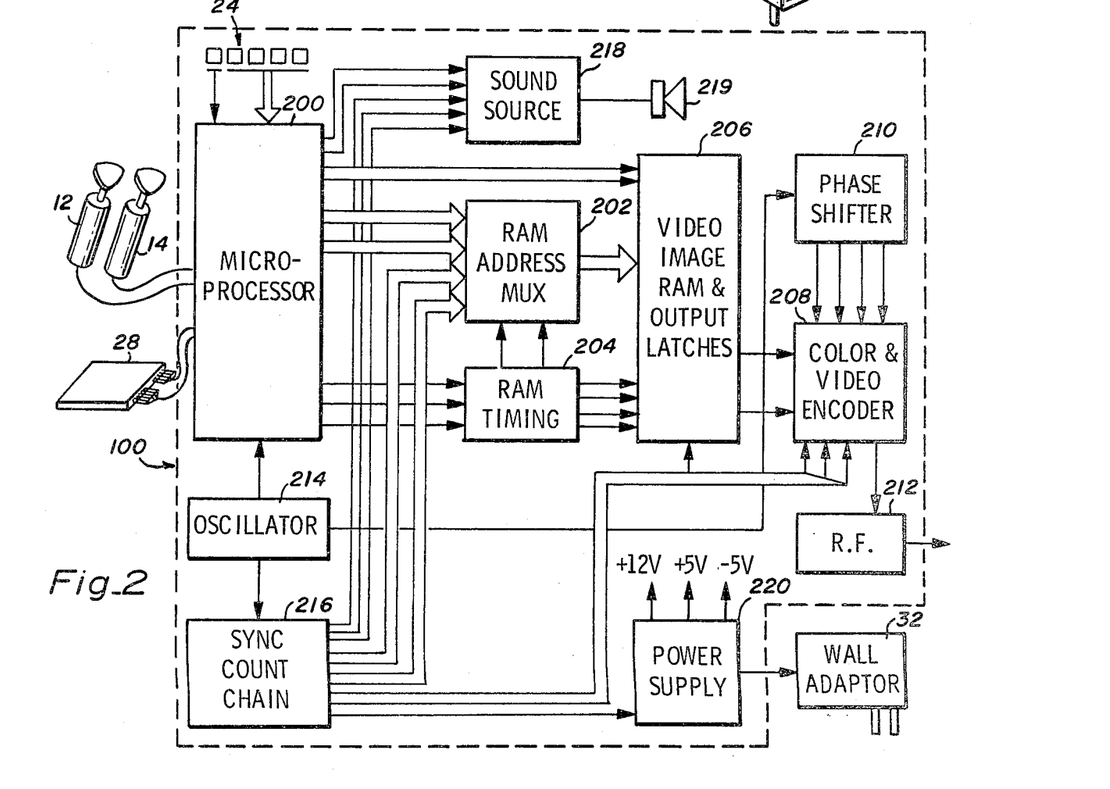
FIG. 2 is a block diagram schematically illustrating the principal components of the video signal generating and control electronics utilized in the embodiment illustrated in FIG. 1.

Referring now to FIG. 2 of the drawing, there is shown a block diagram schematically illustrating the principal operative components of the electronics contained within console 10. These components are contained on a single printed circuit board illustrated by the dashed lines 100 and include a microprocessor 200, a RAM address multiplexer 202, a RAM timing circuit 204, a video image RAM and output latch circuit 206, a color and video encoder 208, a phase shifting circuit 210, an RF modulator 212, an oscillator 214, a sync count chain 216, and a sound generator 218. Also included is a power supply 220 which receives a low voltage AC signal from the wall adaptor 32 and converts it to the DC voltages required to drive the various circuit components.

As previously indicated and explained further below, game selection inputs are entered through the selection buttons 24, player control inputs are made through the hand controllers 12 and 14, and interchangeable game capability is provided by means of the cartridge 28.

In the preferred embodiment, the microprocessor is comprised of a Fairchild F8 3850 central processing unit (CPU) and two F8 3851 program storage units (PSU) with each of the PSUs containing 1024 bytes of the program. This enables the console to permanently contain data relative to at least two games which, in the preferred embodiment, are similar to hockey and ping-pong. The cartridge 28 contains additional PSUs which add to the storage capability of the microprocessor and thus enable additional game and control data to effectively be included in the microprocessor 200.

Communication between the microprocessor 200 and the game selection and control means, and between the microprocessor 200 and the video image RAM 206 is accomplished through the I/O ports of the CPU and the I/O ports of one of the PSUs. The clock signal used to drive the microprocessor has a frequency of 1.8 MHz and is derived from a 3.58 MHz signal generated by oscillator 214.

The video image RAM 206 is comprised of four 4K dynamic RAMs which are arranged 128 bits wide by 65 bits high by 2 bits deep so as to correspond to a video screen display comprising 65 horizontal rows of dots with each row containing 128 dots. Two bits are used to define the color of each dot. Timing for Ram 206 is derived from the video sync count chain 216, and writing into the RAM is accomplished after microprocessor 200 has set up the address and data and has issued a write request. However, the actual writing operation is controlled by the sync count chain. Writing occurs during each horizontal retrace with each retrace normally occurring once every 63 microseconds. Only two bits (corresponding to one dot) are written during each write operation. The address for the RAMs during writing is taken from microprocessor 200, substituting for the sync count chain address that is used during the read operation.

The sync count chain 216 includes a horizontal counter, a vertical counter, a divide-by-7/4 means, a divide-by-4 means, a dot clock filter, and a sync decode circuit. A 7/4 division of the 3.5 MHz signal from oscillator 214 is fed into the horizontal counter to generate a 128-bit horizontal video signal, and is further divided by 4 and fed into the vertical counter to generate a 65-line vertical video signal. Both of these signals are fed into the sync decoder to generate blank, sync, and burst signals. The dot clock pulses are taken at the output of the dot clock filter.

In accordance with the present invention, the colors developed on the television screen are determined by foreground and background bits which are extracted from the microprocessor's memory by the sync count chain and are passed to the video encoder 208 via the output latches of circuit 206. "Background" is defined to mean the painting of stripes horizontally all the way across the screen. The four possible background colors are black, blue, green or gray/white. However, the whole screen need not be painted in one background color. For instance, in the ping-pong game of the present invention, a green background is combined with a black background in the score area. "Foreground" is defined as meaning all that is not background; that is, court outlines, obstacles, scores, players, vehicles, balls and the like, are foreground objects and may have one of four possible foreground colors; namely, green, red, blue and sometimes white. White is a valid foreground color only if the background is black, and is the only color available against a black background. The various color bits are held in the shift registers of circuit 206 until shifted out by the dot clock input from the sync count chain 216.

The color and video encoder 208 accepts both the foreground and background bits, processes them to decide the color of the current dot cell and finally, assigns the proper value of luminance and chrominance. The color signals ultimately selected by encoder 208 are developed by phase shifter 210 and are designated burst, blue, green, and red signals. The burst signal has a frequency of 3.58 MHz and is derived from the output of oscillator 214. The blue signal is derived by inverting the burst signal; the red signal is derived by shifting the phase of the burst signal by 90°; and the green signal is derived by inverting the red signal. After encoding, the video signal is fed to the RF modulator 212 wherein the signals are amplitude modulated on a carrier corresponding to a particular television channel which, in the present embodiment, is at the frequency of channel 3.

In response to an input from microprocessor 200, the sound source 218 is capable of generating three-tone signals from inputs taken from the vertical sync generator. These tone signals are fed to a speaker 219 which renders them audible.

To generally summarize the operation of the circuit, it can be said that the microprocessor 200 takes the players' game selection and parameter selection inputs, via push buttons 24, along with player command inputs which are input via hand controllers 12 and 14, and turns these inputs into data which corresponds to a particular video image. This data is then transmitted to the video RAM 206 for temporary storage. The sync count chain 216 subsequently scans through the video image RAM using the same type of raster scan used by the television set and extracts pairs of bits from the memory of 206 and supplies them to the color and video encoder 208. The encoder in turn interprets each pair of bits, assigns them a luminance level and a chroma phase, and generates a composite video signal which is passed to the RF modulator 212 where such signal is used to amplitude modulate a high frequency carrier. The output of the modulator is a low level signal which is connected directly to the television antenna terminals through the switch 46.

Figure 3:
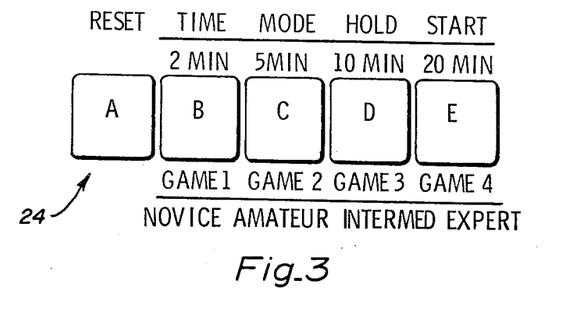
FIG. 3 is a diagram illustrating the functional labeling of the parameter selection buttons of the embodiment illustrated in FIGS. 1 and 2.

In FIG. 3 the five buttons 24 are illustrated along with labels indicating the corresponding inputs selected by depressing the buttons during the selection sequence. Play is initiated by first pressing by the reset button "A." This starts the logic sequence and causes a large "G" and a question mark to be displayed on the television tube to, in effect, request that one of four games be selected. These may be four games internally contained in console 10 or four games contained in an inserted cartridge. The players select the desired game by depressing one of the buttons "B," "C," "D" or "E." After making such selection, a large "S" and a question mark are displayed on the screen to, in effect, request whether or not the players are ready to start. If they are ready to start, they will depress the start button "E" and the game play will begin and continue for a duration of two minutes in the novice mode. However, should they not elect to play for the minimum time and in the low skill level mode, they may elect either a different time or a different mode, or both, by depressing either the time button "B" or the mode button "C."

Assuming button "B" is depressed, a large "T" will be displayed along with a question mark and the players can select any of the four indicated play times by depressing one of the buttons "B-E." Once one of these buttons is depressed, a large "S" and a question mark will again be displayed requesting whether or not the players are ready to start. If so, they will depress the start button "E" and the game will begin. If not, they can depress the mode button "C" and cause a large M and a question mark to be displayed to, in effect, request that they select either the novice, amateur, intermediate or expert mode by depressing one of the buttons "B-E." Having pressed one of these buttons, the large "S" and question mark will again be displayed, and if the start button "E" is thereafter depressed, the game will begin and continue until the selected time interval has expired. Thereafter, until the end of the game, all player inputs to the device are made through the hand controllers 12 and 14, and no further attention need be paid to the buttons 24.

However, if during the play period the players should wish to interrupt the game temporarily, they can depress the hold button "D" and cause all action in the game to be suspended. When they are ready to resume play, they need only depress the start button "E" and play will resume where it left off. Should they wish to quit playing before the selected period has expired, they may simply press the reset button to end the game and the game selection sequence will then have to be reinitiated in order to start a new game. Although this particular set of logical decisions is included in the present embodiment, it will of course be appreciated that any other desired input instructions could be incorporated as well.

Figure 4:
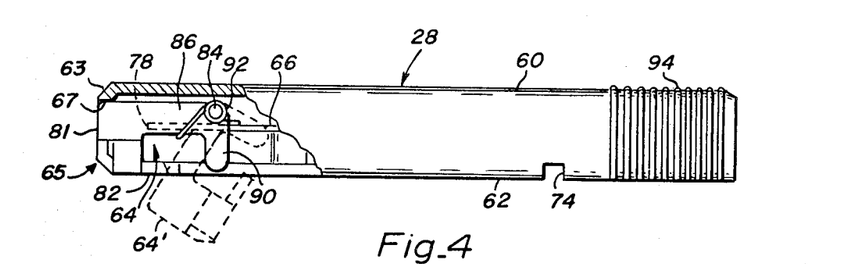
FIGS. 4 and 5 are partially broken side and bottom views, respectively, of the cassette illustrated in FIG. 1.
Figure 5:
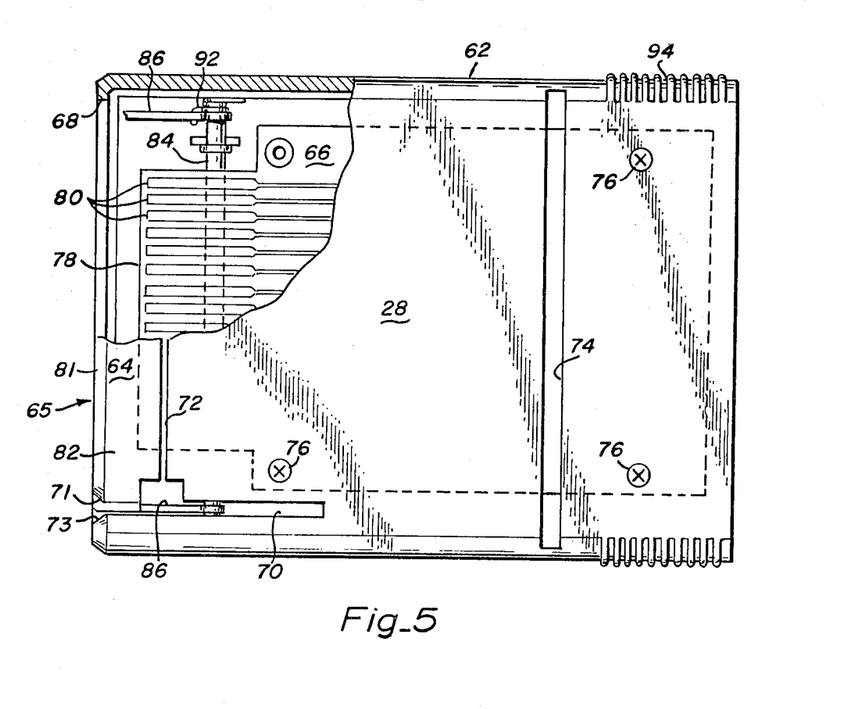

The principal structural features of cartridge 28 are illustrated in the partially broken, side and bottom views shown in FIGS. 4 and 5, respectively. As illustrated, the cartridge 28 is comprised of a two-part outer housing including mating upper and lower parts 60 and 62, a pivotable cartridge door assembly 64, and an enclosed printed circuit (PC) board 66. In the preferred embodiment, the PC board 66 includes two PSUs, each programmed to contain 1024 bits of data. The end 63 of cartridge top 60 has a rectangular cut-out, as indicated by the edges 67 and 68 shown in FIGS. 4 and 5, respectively, to mate with the door assembly 64. Cartridge bottom 62 includes a pair of longitudinally extending guide slots, one of which is shown at 70, and is also cut back as indicated at 72 to mate with door assembly 64. A cartridge-locking groove 74 extends across bottom 62 to lock the cartridge in the cartridge-receiving chute of console 10 as will be described below.

Top 60 and bottom 62 are fastened together by four screws 76 which locate and secure the electronics containing PC board 66 between the cartridge shells. As indicated in FIG. 5, circuit board 66 has a contact end portion 78 with a plurality of contact ribbons 80 formed in parallel along the bottom surface thereof. The end portion 78 is positioned so as to be located immediately behind door assembly 64 for reasons which will follow.

In the preferred embodiment door assembly 64 is comprised of a single, molded unit which includes a two-sided closure 65 having an end portion 81 and a bottom portion 82, a pivot shaft 84, and a pair of generally L-shaped members 86. One leg of each member 86 connects shaft 84 to the closure 65, and the second leg 90 serves as a cam follower which upon engaging a cam causes the closure assembly to pivot into the position illustrated by the dashed lines 64' in FIG. 4. A pair of torsion springs 92 are disposed one at either end of shaft 84 and each have one end-engaging member 86, and the other end engaging the cartridge housing so as to apply a torsional force to the closure assembly causing it to be normally biased into its closed position.

An external design feature of the cartridge 28 is the provision of gripping ribs 94 formed at the end opposite the closure end. In addition to providing a decorative effect, the ribs 94 also provide a gripping surface to facilitate positioning of the cartridge in the console.

Figure 6:
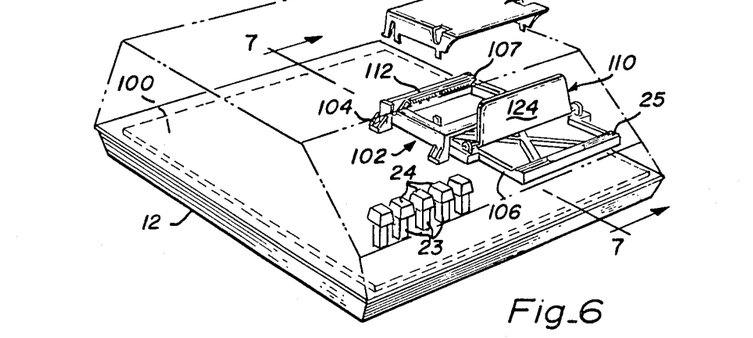
FIG. 6 is a partially exploded perspective view illustrating the push button switches and cartridge-receiving chute of the embodiment shown in FIG. 1.

Turning to FIG. 6 of the drawing, the console base 15 is shown with top 16 removed but outlined in phantom so as to illustrate the positioning of the main PC board 100 which is also shown in phantom. As illustrated, five push button switches 23 including the buttons 24 are mounted to circuit board 100. These switches are electrically connected to the microprocessor 200 as indicated in FIG. 2. A cartridge-receiving chute and connector assembly is shown generally at 102.

Figure 7:
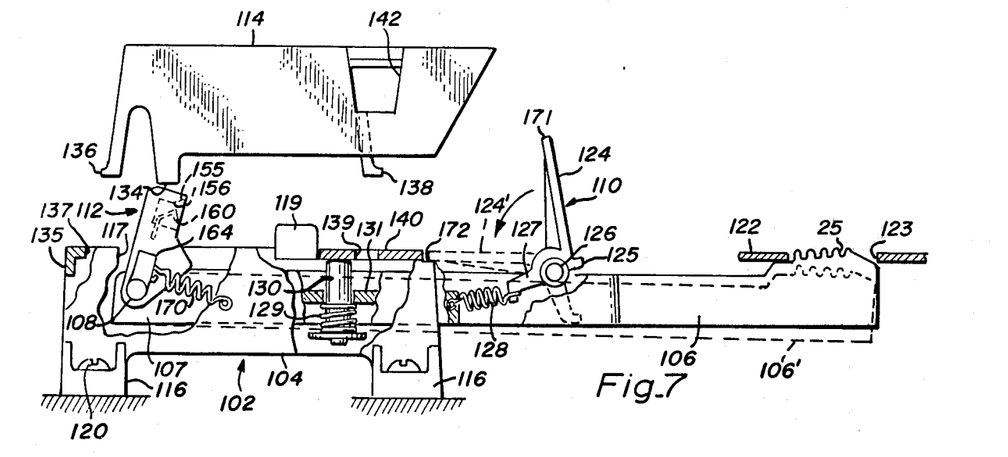
FIG. 7 is a partially broken side view of the cartridge-receiving chute shown in FIG. 6.

Referring now additionally to FIG. 7 of the drawing, which is a partially broken side view taken along the line 7—7 of FIG. 6, it will be noted that assembly 102 includes a four-legged platform 104, a cartridge retainer/ejector assembly including a member 106 pivotally attached to platform 104 at 108 and having a closure assembly 110 affixed thereto, a connector bar 112 which is also pivotally connected to platform 104 at 108, and a cover 114.

The platform 104 is a generally rectangular structure which is open at the top and has four standoff legs 116 that rest upon circuit board 100 and serve to locate the chute assembly in its proper position relative to console opening 26. Each side of member 104 is provided with a generally V-shaped cutout 117 having a rounded bottom forming a bearing surface for shaft 108. A pair of upstanding camming tabs 119 are also provided on top of platform 104 to serve as cartridge centering, stopping, and door opening cams as will be explained below. Platform 104 is secured to circuit board 100 by means of suitable screws or bolts 120.

As illustrated in FIG. 6, member 106 is comprised of elongated, cross-webbed structure having two longitudinal legs 107 (FIG. 7) pivotally attached at one end to platform 104 and their other ends terminating in an integrally formed, transversely extending ejector bar 25. Ejector bar 25 is provided with a raised and ribbed upper surface which is designed to extend through a corresponding opening 123 in console surface 22. Member 106 is rotatable about shaft 108 into the position indicated by the dashed lines 106' but is normally biased into the position illustrated in FIG. 7 by a coil spring 129 which is positioned about a post 130 that extends downwardly from the top of platform 104. Spring 129 exerts an upward force on a cross web 131 which is an integrally formed part of member 106. Closure assembly 110 includes an elongated door 124 (FIG. 6) having an outwardly extending detent rib 125 formed along its lower edge, a shaft 126 formed along its lower edge opposite rib 125, and a lever arm 127 formed in the center of shaft 126. All of these parts are integrally molded in a single piece. Assembly 110 is pivotally affixed to member 106 by springing the side legs 107 outwardly and inserting the ends of shaft 126 into bearing openings formed therein. Door assembly 110 is resiliently biased into the illustrated upstanding position by a spring 128 which has one end attached to the lever 127 and the other end attached to member 106.

Member 106 combines with closure assembly 110 to provide a latching mechanism for holding a cartridge in place once it has been fully inserted into the console and engaged with connector 112. This latching action is effected by detent 125 mating with the groove 74 (see FIGS. 4 and 5) of a cartridge as will be more fully explained below.

Top 114 is a unitary, molded cover member which also serves as a top guide for an inserted cartridge. Top 114 also functions to provide a top bearing surface 134 which holds the shaft 108 in the bottom bearing surface of 117. Top 114 is held in position on platform 104 by means of a pair of integrally formed resilient locking tabs 136 and a pair of relatively rigid tabs 138. In order to mount top 114 to platform 104, tabs 136 are positioned under the lip 137 of a platform cross member 135, with the bearing surface 134 resting on shaft 108, and the cover is forced leftwardly as depicted in FIG. 7 deflecting tabs 136 until tabs 138 can be inserted into apertures 139 in the top of member 104. Once the toes of tabs 138 have moved beneath cross member 140, the leftward pressure can be released and the top will spring into the locked position. The openings 142 are provided for mold relief.

Figure 8:
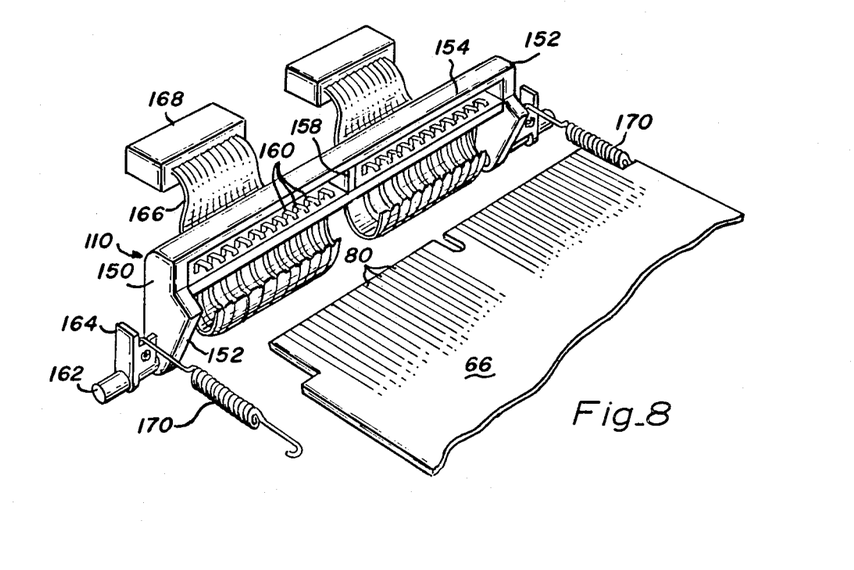
FIG. 8 is a perspective illustration showing the connector assembly of the cartridge-receiving chute illustrated in FIGS. 6 and 7.

The connector assembly 112 is illustrated in further detail in FIG. 8 and includes a pair of end portions 150 having front facing camming surfaces 152 and an elongated central portion 154 forming a connector slot 156 which is divided into two sections by an alignment key 158. As shown by the dashed lines in FIG. 7, the front inside top edge 155 of portion 154 is chamferred to provide ease of entry for a cartridge PC board into slot 154. A plurality of upstanding resilient contact members 160 extend upwardly through the bottom of central portion 154 and into the slot 156. As will be explained more fully below, the contact members 160 are positioned below the level of the bottom surface of a cartridge PC board so that they provide no interference to its entry into the slot. Extending outwardly from the lower portion of each end member 150 is a shaft segment 162 having an upstanding biasing web 164 affixed thereto.

The conductors of a pair of ribbon leads 166 have one end connected to various ones of the contact members 160 and the other end connected to a terminal of suitable jacks or plugs 168. The connector assembly is resiliently biased into the position illustrated in FIG. 7 by tension springs 170 which have one end affixed to the webs 164 and the opposite end affixed to a wall of member 106.

Figure 9:
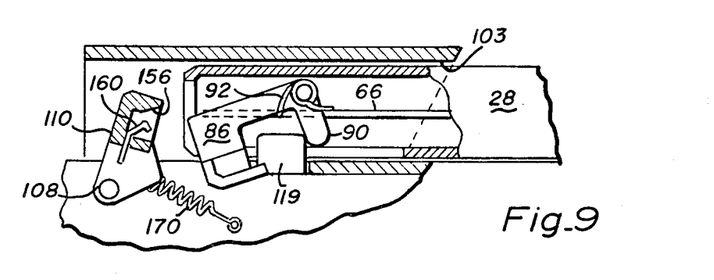
FIGS. 9, 10 and 11 are partially broken side views sequentially illustrating mating action between cartridge and chute connector assembly in accordance with the present invention.
Figure 10:
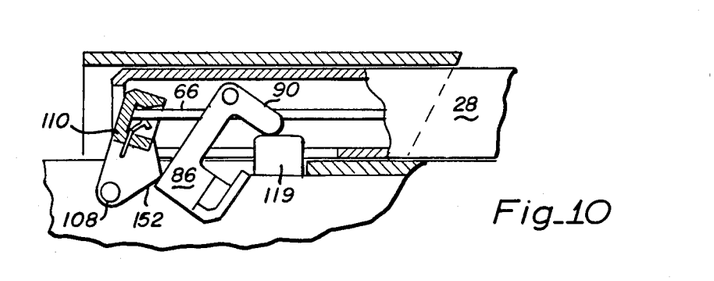
Figure 11:
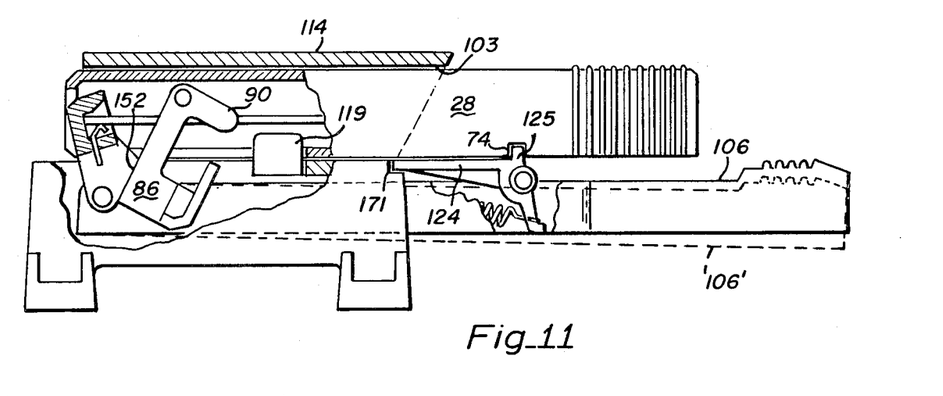

Referring now additionally to FIGS. 9, 10 and 11, the cartridge insertion and connecting operation will be described. Note that connector assembly 110 is shown in FIGS. 9 and 10 in its cartridge engaging position while in FIG. 11 it is shown in its cartridge connecting position. Having selected a particular cartridge for play, the closure carrying end of the cartridge is inserted into the opening 26 (FIG. 1) causing the door 124 to be rotated downwardly into the position indicated by the dashed lines 124' (FIG. 7) and out of the way with its edge 171 seated in a recessed edge 172 of platform 104. The cartridge is then pushed further into the receiving chute until the camferred surfaces 71 and 73 (FIG. 5) at the opening ends of slots 70 engage the alignment tabs 119 and cause the slots 70 to track therealong. The cartridge is then further moved into the chute until eventually the arms 90 of assembly 64 engage the front side of tabs 119 and in camming thereover cause the closure member 64 to start rotating downwardly as illustrated in FIG. 9.

As the cartridge continues to move leftwardly into the position illustrated in FIG. 10, the top of members 86 will engage the camming faces 152 of connector ends 150 and lift legs 90 out of engagement with tabs 119. Further leftward movement of cartridge 28 and engagement of connector assembly 110 by circuit board 66 causes connector assembly 110 to rotate into the cartridge-connecting position illustrated in FIG. 11. Since the horizontal clearance between the upper surface of slot 156 and the uppermost surface of contacts 160 is slightly greater than the thickness of the contact strip edge portion of circuit board 66, very little resistance to movement of the board into slot 156 will be encountered. However, as the contactor is caused to rotate rearwardly about its shaft 108, a substantial wiping action of contact against contact strip and an increase in contact pressure will nevertheless be effected so as to adequately pierce any oxide build-up on the contact strips or contacts themselves and thus provide good electrical contact.

Even though the actual contact force between contact and contact strip is quite high due to the multiplicity of contacts made, the forces required to make the contact are only partially reflected into the translational force which must be applied by the player to fully seat the cartridge in the connector. In fact, the principal forces that must be overcome in loading a cartridge into the console are only those attributed to resisting the connector return springs 170 and the cartridge door closure springs 92 (FIG. 5).

Note that during the movement of cartridge 28 into the receiving chute, engagement with the bottom surface 103 of top 114 causes the bottom of cartridge 28 to exert a downward force on detent 125 thereby causing the ejector assembly 106 to be deflected downwardly to assume the position illustrated by the dashed lines 106' until such time as the slot 74 becomes aligned with the detent 125. At such time ejector assembly 106 will rotate back into its upper position with detent 125 locking cartridge 28 in place. The cartridge is at this point fully inserted and any game contained therein may be selected by depressing the proper combination of buttons 24. When the player later decides to eject the cartridge 28, he will merely apply downward pressure upon the ejector bar 25 to cause the assembly 106 to rotate back into the position illustrated by the dashed lines 106' and thereby cause detent 125 to be withdrawn from slot 74. Since there is at this time no force applied to cartridge 28 tending to overcome the spring forces of connector springs 170 and closure springs 92 (FIG. 9), the forces exerted by those springs will cause the cartridge to be moved a short distance rightwardly so that detent 125 will no longer engage slot 74 and the cartridge may then be pulled out of opening 26 to be replaced by another cartridge if desired.

Figure 12:
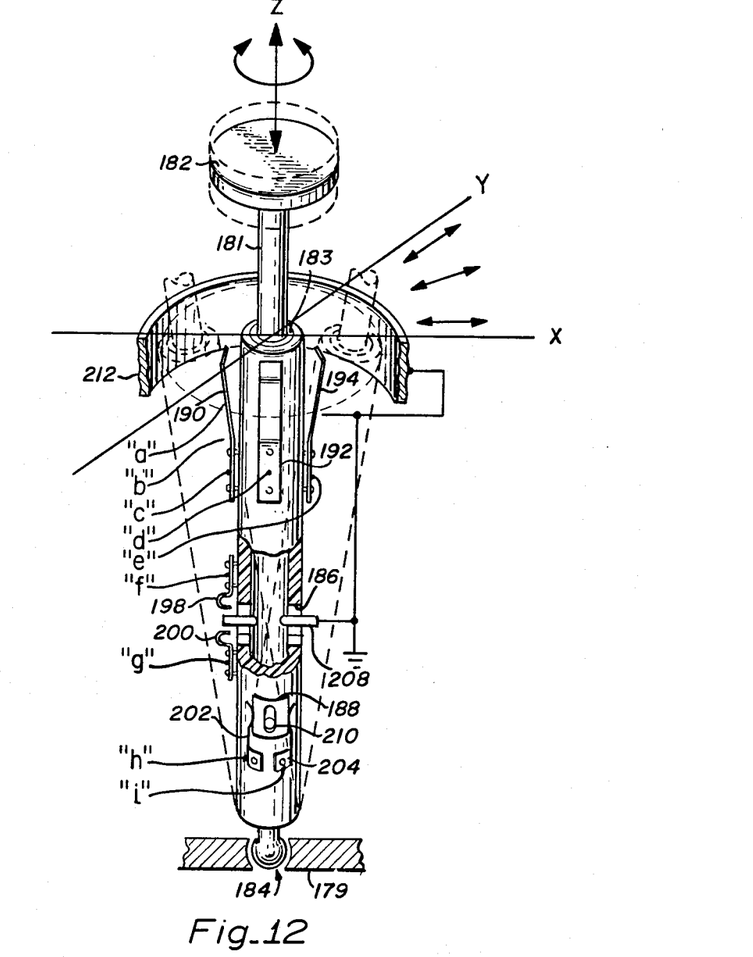
FIG. 12 is a partially broken pictorial illustration of the operative components of the hand controller illustrated in FIG. 1.

In FIG. 12 of the drawing, a functional representation of the principal operative components of the hand controllers 12 and 14 is schematically illustrated. For simplicity of illustration, no representation of the outer housing is made other than that representing the pivot structure 179. In addition to the outer housing (see FIG. 1), the principal components of each hand controller are an elongated tubular member 180, an elongated shaft 181, a knob 182, and various electrical switching means. Member 180 is of a nonconductive material and has an axial bore 183 extending longitudinally therealong for substantially its entire length. The lowermost end of member 180 is pivotally attached to the housing as schematically illustrated at 184. Member 180 is also provided with a pair of apertures 186 and 188 passing transversely therethrough.

Attached to the outer surface of the upper portion of member 180 are four electrical contact strips 190, 192, 194 and 196 (not shown). A pair of contacts 198 and 200 are respectively affixed above and below aperture 186, and a second pair of contacts 202 and 204 are respectively affixed to member 180 on each side of the opening 188. One end of the nonconductive shaft 181 extends into bore 183 and the handle 182 is affixed to the other end thereof. A pair of conductive contact rods 208 and 210 extend transversely through shaft 181 and are carried thereby in alignment with the centers of apertures 186 and 188, respectively.

Suitable spring means (not shown) are also provided for normally biasing member 180 into the central positions illustrated and for normally biasing shaft 206 into a position such that the rods 208 and 210 are centered within the respective apertures 186 and 188. Such means must, however, be resilient enough to allow shaft 181 to be rotated slightly about the Z axis so that rod 210 can engage contacts 202 and 204, and must likewise be capable of allowing shaft 181 to move axially up and down far enough to engage contacts 198 and 200.

A conductive band 212 which is carried by the controller housing circumscribes the upper portion of member 180 to provide a ground ring that may be engaged by the contacts 190–196 when member 180 is tilted about the pivot 184.

As was mentioned above, electrical communication between the hand controllers and the console electronics is made through a pair of nine conductor cables including the conductors labeled "a"–"i" in FIG. 12. The ground lead line "a" is connected to ground ring 212 as well as to contact rods 208 and 210 which are internally shorted together. Lead lines "b"–"e" are respectively connected to the contact strips 190–196, and lead lines "f"–"i" are respectively connected to the contactors 198–204.

A tilting of member 180 in any direction in the X-Y plane will cause one or two of the contacts 190–196 to be shorted to ground thereby allowing a corresponding control function to be effected by electrical circuitry responsive thereto. Similarly, a rotation of the handle 182 about the Z axis will, depending upon the direction of rotation, cause either the contact 202 or the contact 204 to be shorted to ground. An upward motion of handle 182 along the Z axis will cause contact 198 to be shorted to ground, and similarly, a downward motion will cause contact 200 to be shorted to ground.

It will thus be appreciated that as many as eight separate control switching functions can be initiated using the present device. It is to be understood that by logically combining the electronics responsive to two or more of the hand controller switches, additional control functions can also be implemented. However, in the preferred embodiment, the eight switching functions interface directly to the I/O port of the microprocessor wherein closing of any of the various switches causes corresponding I/O port pins to be pulled to ground. The software contained within the microprocessor is designed to interpret the switch closures in a manner so as to eliminate the mechanical intermittancy which normally occurs due to contact bounce. This feature makes possible the use of simple manually operable switches such as those illustrated and thus eliminates the need for the potentiometer type of joy stick control which is common in the prior art.

Although a particular type of hand controller is suggested by the embodiment of FIG. 12, it is contemplated that other types of controllers could also be used to provide the desired control inputs.

The present invention has been described above with respect to a particular preferred embodiment. It is, however, contemplated that numerous alterations and modifications will be apparent to those skilled in the art after having read the above disclosure, and it is therefore intended that the following claims be interpreted as covering all such alterations and modifications as fall within the true spirit and scope of the invention.

What is claimed is:

1. A data storage cartridge means for use in apparatus for the playing of video games and the like, said apparatus including a console means having signal-generating and processing means and a chute for receiving said data storage cartridge means, said chute having connector means pivotally mounted and rotatable between a cartridge-engaging position and a cartridge-connection position and including a pair of end portions each having a camming surface and an elongated central portion forming a connector slot with a plurality of upstanding resilient contact members extending upwardly through the bottom of said central portion, said central portion having a chamferred surface to provide ease of entry for an end portion of a circuit-board means, said end portion engaging said chamferred surface upon insertion of said cartridge and facilitating pivoting of said connector means, said elongated central portion of said connector means including an alignment key means which divides said central portion into two sections, said chute including a closure assembly for locking an inserted cartridge means in said chute, said closure assembly having an elongated door which is rotatably mounted to rotate open upon insertion of a cartridge means, and an outwardly-extending detent rib for rotation into engagement with an inserted cartridge, said cartridge means including housing means having a bottom surface with slot means which engages said detent rib to latch said cartridge means within said chute, said data storage cartridge means comprising circuit-board means having a plurality of contacts on an end portion for mating with contacts of said connector means, means for engaging said connector means and pivoting said connector means upon insertion of said cartridge means in said chute whereby said connector means, engages said contacts of said circuit-board means, said end portion being insertable into said connector whereby said plurality of upstanding resilient contact members engage said contacts on said board means, and said board including a notched portion for mating with said alignment key means to facilitate alignment of said board means in said elongated central portion.

2. A data storage cartridge means as defined by claim 1 wherein said chute further includes a support member on which said closure assembly is mounted and which defines a bottom surface of said chute, said support member being yieldably mounted to deflect downwardly, and a top cover for said chute covering said connector means and cooperating with said elongated door to define an enclosed portion of said chute; said housing means of said cartridge upon insertion in said chute engaging the bottom surface of said chute top cover and said detent rib of said closure assembly thereby deflecting said support member downwardly until said detent rib engages said slot means of said cartridge housing means.

3. A data storage cartridge means as defined by claim 2 wherein said support member includes two alignment tabs for alignment of said cartridge means, said housing of said cartridge means including guide slots which receive said alignment tabs of said support member upon insertion of a cartridge means into said chute.

4. A data storage cartridge means as defined by claim 3 wherein said housing means of said cartridge means includes a door assembly pivotally mounted and biased in a closed position and including cam means for opening said door assembly upon insertion of said cartridge means into said chute.

5. A data storage cartridge means as defined by claim 4 wherein said cam means engages said projecting guide slots for opening said door assembly.

6. A data storage cartridge means for use in apparatus for the playing of video games and the like, said apparatus including a console means having signal-generating and processing means and a chute for receiving said data storage cartridge means, said chute having connector means pivotally mounted and rotatable between a cartridge-engaging position and a cartridge-connection position and including a closure assembly for locking an inserted cartridge means in said chute, said closure assembly including an elongated door which is rotatably mounted to rotate open upon insertion of a cartridge means, and an outwardly-extending detent rib for rotation into engagement with an inserted cartridge;

said data storage cartridge means comprising circuit-board means having a plurality of contacts for mating with contacts of said connector means, and housing means having a bottom surface with slot means which engages said detent rib to latch said cartridge means within said chute, and means for engaging said connector means and pivoting said connector means upon insertion of said cartridge means in said chute whereby said connector means engages said contacts of said circuit-board means.

7. A data storage cartridge means as defined by claim 6 wherein said chute further includes a support member on which said closure assembly is mounted and which defines a bottom surface of said chute, said support member being yieldably mounted to deflect downwardly, and a top cover for said chute covering said connector means and cooperating with said elongated door to define an enclosed portion of said chute; said housing means of said cartridge upon insertion in said chute engaging the bottom surface of said chute top cover and said detent rib of said closure assembly thereby deflecting said support member downwardly until said detent rib engages said slot means of said cartridge housing means.

8. A data storage cartridge means as defined by claim 7 wherein said support member includes two alignment tabs for alignment of said cartridge means, said housing of said cartridge means including guide slots which receive said alignment tabs of said support member upon insertion of a cartridge means into said chute.

9. A data storage cartridge means as defined by claim 8 wherein said housing means of said cartridge means includes a door assembly pivotally mounted and biased in a closed position and including cam means for opening said door assembly upon insertion of said cartridge means into said chute.

10. A data storage cartridge means as defined by claim 9 wherein said cam means engages said projecting guide slots for opening said door assembly.

11. Connector means for video game apparatus comprising:
base means;
an elongated body having a groove formed in one side thereof and a plurality of resilient contact elements extending into said groove along one wall thereof and cooperating with an opposite wall thereof to define a printed circuit board receiving slot; and
pivot means pivotally attaching said body to said base means and permitting said body to rotate about a pivot axis fixed in position relative to said base means between an engaging position and a connecting position such that when the terminal-containing edge of a printed-circuit board is inserted into said slot with said body in said engaging position and the board is then further moved in the inserting direction it causes said body to rotate about said pivot mans into said connecting position thereby wedging the circuit-board edge between said contact elements and said opposite wall.

12. Connector means for video game apparatus as recited in claim 11 wherein said base means includes guide means defining an engaging plane along which the circuit board moves as it mates with said receiving slot, said engaging plane lying tangent to an imaginary cylindrical surface concentric with said pivot axis.

13. Connector means for video game apparatus as recited in claim 12 and further comprising means for resiliently biasing said body into said engaging position.

14. In apparatus for the playing of video games and the like, including a console means having signal generating and processing means, means for providing auxiliary signal information to said signal generating and processing means comprising: cartridge means including data storage means for said auxiliary signal information, and chute means in said console means for receiving said cartridge means and having connector means for providing electrical connection to said data storage means, wherein said cartridge means includes an outer housing and a printed circuit board having electronic components mounted thereto, said outer housing enclosing said circuit board and said electronic components forming said data storage means, wherein said outer housing is generally rectangular and has an opening along one side to permit electrical connection to said printed circuit board and wherein said cartridge means further includes closure means for closing said opening when no electrical connection is to be made to said circuit board, wherein said closure means includes a door which is pivotally attached to said outer housing and opening means for rotating said door into an open position when said cartridge means is received within said chute means.

15. Means as recited in claim 14 wherein said chute means includes cam means and wherein said opening means includes a cam follower affixed to said door and positioned so as to engage and follow said cam means and thereby rotate said door into the open position as said cartridge means is received within said chute means.

16. Means as recited in claim 15 wherein said cam means includes an up-standing tab and said outer housing includes a slot for receiving said tab, said tab and said slot cooperating to align said cartridge means relative to said chute means.

17. In apparatus for the playing of video games and the like, including a console means having signal generating and processing means, means for providing auxiliary signal information to said signal generating and processing means comprising: cartridge means including data storage means for said auxiliary signal information, and chute means in said console means for receiving said cartridge means and having connector means for providing electrical connection to said data storage means, wherein said cartridge means includes an outer housing and a printed circuit board having electronic components mounted thereto, said outer housing enclosing said circuit board and said electronic components forming said data storage means, wherein said printed circuit board includes an edge portion having a plurality of terminal strips, and wherein said connector means includes a plurality of resilient contact elements pivotally mounted relative to said chute means and means for rotating said contact elements into engagement with said terminal strips as said cartridge is received within said chute means, wherein said connector means includes an elongated body forming a connector slot for receiving said edge portion, said contact elements being secured to said body and extending into said slot, said connector means further including pivot means affixed to said body for pivotally mounting said body about an axis fixed relative to said console means, said body being rotatable about said pivot means between a cartridge-engaging position and a cartridge-connection position.

18. Means as recited in claim 17 wherein said connector means further includes resilient means for normally biasing said body into said cartridge-engaging position.

19. A data storage cartridge means for use in apparatus for the playing of video games and the like, said apparatus including a console means having signal-generating and processing means and a chute for receiving said data storage cartridge means, said chute having connector means pivotally mounted and rotatable between a cartridge-engaging position and a cartridge-connection position and a closure assembly for locking an inserted cartridge means in said chute;

said data storage cartridge means comprising circuit-board means having a plurality of contacts for mating with contacts of said connector means, and housing means having means for mating with said closure assembly to latch said cartridge means within said chute, and means for engaging said connector means and pivoting said connector means upon insertion of said cartridge means in said chute whereby said connector means engages said contacts of said circuit-board means.

20. Connector means for video game apparatus comprising: base means; an elongated body having a groove formed in one side thereof and a plurality of resilient contact elements extending into said groove along one wall thereof and cooperating with an opposite wall thereof to define a printed circuit board receiving slot; and attaching means movably attaching said body to said base means and permitting said body to move between an engaging position and a connecting position such that when the terminal-containing edge of a printed circuit board is inserted into said slot with said body in said engaging position and the board is then further moved in the inserting direction it causes said body to move into said connecting position, causing said contact elements to move so that the contact elements are urged through said contact element movement against a so-positioned circuit board edge, wherein the attaching means comprises pivot means pivotally attaching said body to said base means and permitting said body to rotate about a pivot axis fixed in position relative to the base means between an engaging position and a connecting position, and wherein the contact elements are caused to rotate with the body so that the contact elements are urged against a so-positioned circuit board edge.

21. The connector means of claim 20 and further comprising means for resiliently biasing said body into said engaging position.

* * * * *